US012787805B2

(12) United States Patent
Yandoc et al.

(10) Patent No.: US 12,787,805 B2
(45) Date of Patent: Nov. 3, 2026

(54) SEMICONDUCTOR DEVICE AND A METHOD OF MANUFACTURING SUCH SEMICONDUCTOR DEVICE

(71) Applicant: NEXPERIA B.V., Nijmegen (NL)

(72) Inventors: Ricardo Yandoc, Nijmegen (NL); Dilder Chowdhury, Nijmegen (NL)

(73) Assignee: NEXPERIA B.V., Nijmegen (NL)

( * ) Notice: Subject to any disclaimer, the term of this patent is extended or adjusted under 35 U.S.C. 154(b) by 854 days.

(21) Appl. No.: 17/991,117

(22) Filed: Nov. 21, 2022

(65) Prior Publication Data

US 2023/0163053 A1 May 25, 2023

(30) Foreign Application Priority Data

Nov. 19, 2021 (EP) .................................... 21209345

(51) Int. Cl.

*H10W 70/40* (2026.01)
*H10D 30/47* (2025.01)
*H10D 84/83* (2025.01)
*H10W 40/10* (2026.01)
*H10W 74/01* (2026.01)

(52) U.S. Cl.

CPC .......... *H10W 70/481* (2026.01); *H10D 30/47* (2025.01); *H10D 84/83* (2025.01); *H10W 40/10* (2026.01); *H10W 74/01* (2026.01)

(58) Field of Classification Search

CPC ... H01L 23/49562; H01L 23/36; H01L 21/56; H10D 30/47; H10D 84/83

See application file for complete search history.

(56) References Cited

U.S. PATENT DOCUMENTS 7,741,158 B2 * 6/2010 Leung ..................... H01L 24/97 257/713
2002/0190397 A1 * 12/2002 Kim .................... H01L 23/4334 257/E23.125
2004/0012099 A1 * 1/2004 Nakayama ........ H01L 23/49811 257/E23.101
2010/0252923 A1 * 10/2010 Watanabe ............... H01L 24/32 257/E23.06

(Continued)

FOREIGN PATENT DOCUMENTS

CN 112117251 A 12/2020
JP 2016103616 A 6/2016

OTHER PUBLICATIONS

Extended European Search Report for corresponding European application EP21209345.4, 10 pages dated May 30, 2022.

*Primary Examiner* — Jeff W Natalini
*Assistant Examiner* — Andrew John Zabel
(74) *Attorney, Agent, or Firm* — Ruggiero McAllister & McMahon LLC

(57) ABSTRACT

A semiconductor device is provided, which includes a package with a first surface side and a second surface side opposite to the first surface side. The package includes at least one semiconductor structure and a group of terminals, and the group of terminals is connected to the at least one semiconductor structure and mounted and exposed on the first surface side of the package. The package further includes at least one heat slug mounted and exposed on the second surface side of the package, and at least one feed-through wire in the package so that the feed through wire electrically connects with the at least one heat slug.

16 Claims, 6 Drawing Sheets

(56) References Cited

U.S. PATENT DOCUMENTS

| | | | | |
|---|---|---|---|---|
| 2012/0061816 | A1* | 3/2012 | Song | H01L 23/3128<br>257/E23.079 |
| 2012/0091570 | A1* | 4/2012 | Pan | H01L 23/49548<br>257/676 |
| 2014/0084431 | A1* | 3/2014 | Briere | H01L 23/49568<br>257/675 |
| 2016/0233189 | A1* | 8/2016 | Shimote | H01L 21/563 |
| 2017/0018535 | A1* | 1/2017 | Han | H01L 24/49 |
| 2019/0068045 | A1* | 2/2019 | Ramabhadran | H05K 1/111 |
| 2019/0081078 | A1* | 3/2019 | Miyano | H10D 84/08 |

* cited by examiner

SEMICONDUCTOR DEVICE AND A METHOD OF MANUFACTURING SUCH SEMICONDUCTOR DEVICE

CROSS REFERENCE TO RELATED APPLICATION

This application claims the benefit under 35 U.S.C. § 119(a) of European Application No. 21209345.4 filed Nov. 19, 2021, the contents of which are incorporated by reference herein in their entirety.

BACKGROUND OF THE DISCLOSURE

1. Field of the Disclosure

The present disclosure relates to a semiconductor device and a method of manufacturing such semiconductor device.

2. Description of the Related Art

A package where heat occurs at both sides of the device are known. Such packages are, for example, embedded packages, SRD dual cool packages, source down packages or inverted packages. Those packages are either difficult to manufacture or are not transferring heat efficiently to both sides of the package.

Accordingly, it is a goal of the present disclosure to provide an improved thermal performance of a semiconductor device. Furthermore the present disclosure will provide a cost effective alternative to using ceramic substrates and bare die. Also power density will improve due to PCB temperature reduction which will allow to place components closer."

SUMMARY

According to a first example of the disclosure, a semiconductor device consisting of a package with a first surface side and a second surface side opposite to the first surface side. The package comprising at least one semiconductor structure and a group of terminals, wherein the group of terminals is connected to the at least one semiconductor structure and mounted and exposed on the second surface side of the package. The package further comprising at least one heat slug mounted and exposed on the first surface side of the package, and at least one feedthrough wire in the package such that the feed through wire electrically connects with the at least one heat slug.

Preferably the semiconductor structure is a transistor.

Preferably the semiconductor structure is a cascode, preferably the cascode comprises a high-electron-mobility transistor and a metal-oxide semiconductor field-effect transistor, wherein a source terminal of the high-electron-mobility transistor is electrically connected to a drain terminal of the metal-oxide semiconductor field-effect transistor, and where a gate terminal of the high-electron-mobility transistor is electrically connected to a source terminal of the metal-oxide semiconductor field-effect transistor.

Preferably the semiconductor structures form a half bridge.

Preferably a first terminal is connected to the drain terminal of the high-electron-mobility transistor of a first cascode, a second terminal is electrically connected to the gate terminal of the metal-oxide semiconductor field-effect transistor of the first cascode, a third terminal is electrically connected to the source terminal of the metal-oxide semiconductor field-effect transistor and the gate terminal of the high-electron-mobility transistor of the first cascode and the drain terminal of the high-electron-mobility transistor of a second cascode, a fourth terminal is electrically connected to the gate terminal of the metal-oxide semiconductor field-effect transistor of the second cascode and the fifth terminal is electrically connected to the source terminal of the metal-oxide semiconductor field-effect transistor and the gate terminal of the high-electron-mobility transistor of the second cascode, wherein the third terminal is electrically connected with a first heat slug and the fifth terminal is electrically connected to a second heat slug.

According to a second example of the disclosure a method of manufacturing the semiconductor device according to the disclosure is proposed, the method comprising steps of:

a) preparing a lead frame having a first surface side and a second surface side opposite from the first surface side, the lead frame comprising a group of terminals of the first surface side,
b) placing at least one semiconductor structure having a first surface side and a second surface side opposite from the first surface side, with its second surface side on the first surface side of the lead frame,
c) placing at least one heat slug on the first surface side of the at least one semiconductor structure,
d) down bonding at least one feedthrough wire on at least one terminal on the first surface side of the lead frame,
e) molding the lead frame, the at least one semiconductor structure, the at least one heat slug and the at least one feedthrough into a package having a first surface side and a second surface side opposite to the first surface side,
f) exposing the at least one feedthrough wire and the at least one the heat slug through removal of a layer of material from the first surface side of the package,
g) forming an electrical connection through printing of a copper deposition on the exposed parts of the at least one heat slug and the at least one feedthrough wire,
h) plating of the printed copper deposition.

Preferably the removal step f) is performed by means of the step of polishing.

Preferably the steps a)-c) involve the step of sintering or the step of soldering.

Preferably the step b) comprises the sub-steps b1) and b2):

b1) placing as the at least one semiconductor structure at least one metal-oxide semiconductor field-effect transistor on the first surface side of the lead frame, and
b2) placing as at least one further semiconductor structure at least one high-electron-mobility transistor on the first surface side of the lead frame, such that every high-electron-mobility transistor at least partly overlaps the at least one metal-oxide semiconductor field-effect transistor.

BRIEF DESCRIPTION OF THE DRAWINGS

The disclosure will now be discussed with reference to the drawings, which show in.

DETAILED DESCRIPTION

Figure 1:
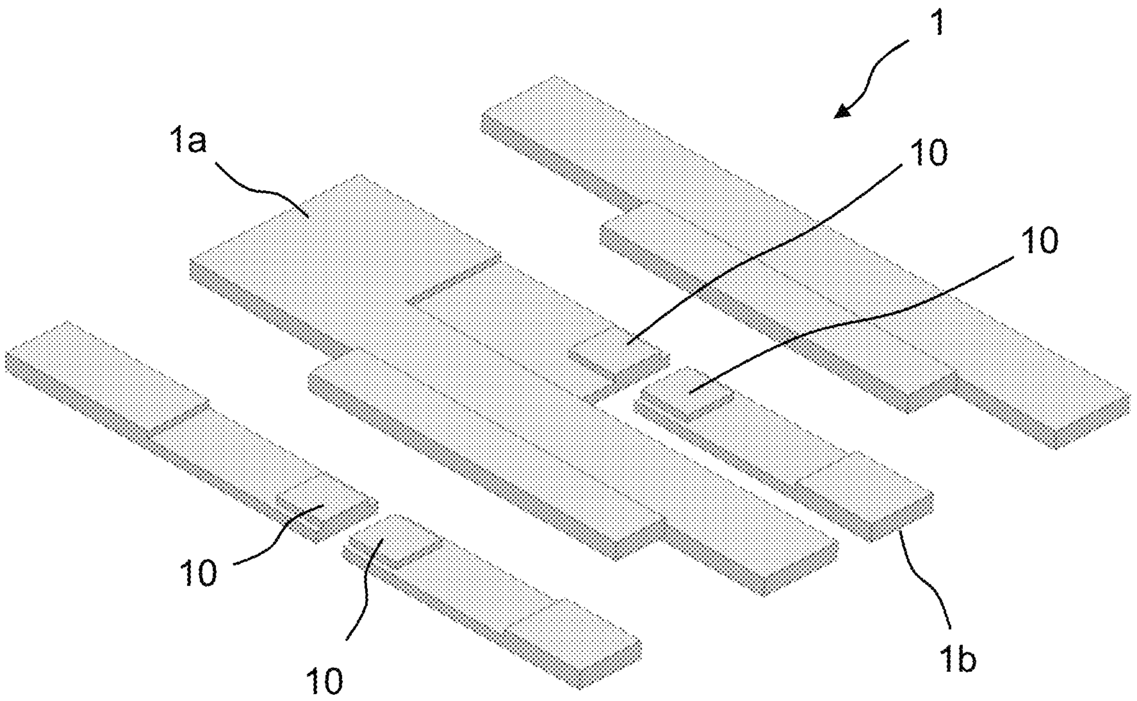
FIG. 1 depicts a lead frame of a semiconductor device.

For a proper understanding of the disclosure, in the detailed description below corresponding elements or parts of the disclosure will be denoted with identical reference numerals in the drawings. Throughout a whole application reference numerals will refer to:

1 lead frame
1*a* first surface side of lead frame
1*b* second surface side of lead frame
2 solder
3 first semiconductor structure
3*a* first surface side of first semiconductor structure
3*b* second surface side of first semiconductor structure
4 further semiconductor structure
4*a* first surface side of second semiconductor structure
4*b* second surface side of second semiconductor structure
5 heat slug
6 feedthrough wire
7 package
7*a* first surface side of package
7*b* second surface side of package
8 copper deposition
9 plated surface
10 terminals The disclosure is a method of assembling a source down semiconductor package with top and bottom exposed terminals using package polishing, down bonding and Cu printing method to form, preferably, HEMT gate to FET source connections.

The method is applicable in either a standard or a half bridge configuration GaN cascode or a standard products using clip bonding method, where one or two polarities located in either top or bottom of a die such as vertical products. The concept is designed for a standard dual cool package, it can also apply to a standard source down package. The person skilled in the art will know that the present disclosure may be applied to other semiconductor devices.

Source down power packages are becoming famous due to better performance it can contribute which results in low parasitic inductance, lower package resistance and high current.

Combining a source down package with a top cooled drain (or source/gate) will increase advantage on thermal performance, either by adding heatsink on top of it, or using a water/air cooling system.

Other known advantages of introducing a source down cool package are a cost effective alternative to using ceramic substrates and bare dies, as in demanding applications such as EPS it allows the use of FR4 PCB's instead of bare die modules.

Also it is a potential alternative to bare die modules in BRM systems (10-20 kW) which requires a water cooling system.

Furthermore, it improves a power density, especially in dual redundant systems. Cooling HEMTs or MOSFETs from the top helps to reduce the PCB temperature. Lower PCB temperatures allows components to be placed closer to the MOSFETs.

The figures depict an example of a semiconductor device according to the disclosure. It consists of a package (reference numeral 7) with a first surface side 7*a* and a second surface side 7*b* opposite to the first surface side 7*a*. The first surface side 7*a* can be the upper or top surface side of the package 7, whereas the second surface side 7*b* can be the lower or bottom surface side of the package 7. The package 7 further comprises at least one semiconductor structure (indicated with reference numerals 3 and 4), such as a power transistor or a half bridge, and a group of terminals 8 (10). The group of terminals 8 (10) is connected to the at least one semiconductor structure 3, 4 and are mounted and exposed on the second surface side 7*b* of the package 7.

In an example shown in FIGS. 1-13 a cascode formed of two transistors is presented, however a person skilled in the art will understand that any semiconductor device may be used. The package 7 further comprises at least one heat slug 5 mounted and exposed on the first surface side 7*a* of the package 7. At least one feedthrough wire 6 is positioned in the package 7 such that the feedthrough wire 6 electrically connects with the at least one heat slug 5.

The semiconductor device, as described hereinbefore, will allow to transfer heat to both sides of a package which will allow heat dissipation more efficient. It is especially important in power devices such as a half bridge.

Preferably the semiconductor structure is a cascode. Even more preferably the cascode comprises a high-electron-mobility transistor and a metal-oxide semiconductor field-effect transistor, wherein a source terminal of the high-electron-mobility transistor is electrically connected to a drain terminal of the metal-oxide semiconductor field-effect transistor, and where a gate terminal of the high-electron-mobility transistor is electrically connected to a source terminal of the metal-oxide semiconductor field-effect transistor.

In yet another example a first terminal is connected to the drain terminal of the high-electron-mobility transistor of a first cascode. A second terminal is electrically connected to the gate terminal of the metal-oxide semiconductor field-effect transistor of the first cascode. A third terminal is electrically connected to the source terminal of the metal-oxide semiconductor field-effect transistor and the gate terminal of the high-electron-mobility transistor of the first cascode and the drain terminal of the high-electron-mobility transistor of a second cascode. A fourth terminal is electrically connected to the gate terminal of the metal-oxide semiconductor field-effect transistor of the second cascode and the fifth terminal is electrically connected to the source terminal of the metal-oxide semiconductor field-effect transistor and the gate terminal of the high-electron-mobility transistor of the second cascode, wherein the third terminal is electrically connected with a first heat slug and the fifth terminal is electrically connected to a second heat slug.

Below a method according to the disclosure is presented for manufacturing the semiconductor device as described hereinbefore. In a first step, denoted as step a, a lead frame 1 is prepared as shown in FIG. 1. The lead frame 1 has a first surface side 1*a* and a second surface side 1*b* opposite from the first surface side 1*a*. The lead frame 1 comprises a group of terminals 10 on the first surface side 1*a*. Those terminals 10 will be connected to at least one semiconductor structure 3.

Figure 3:
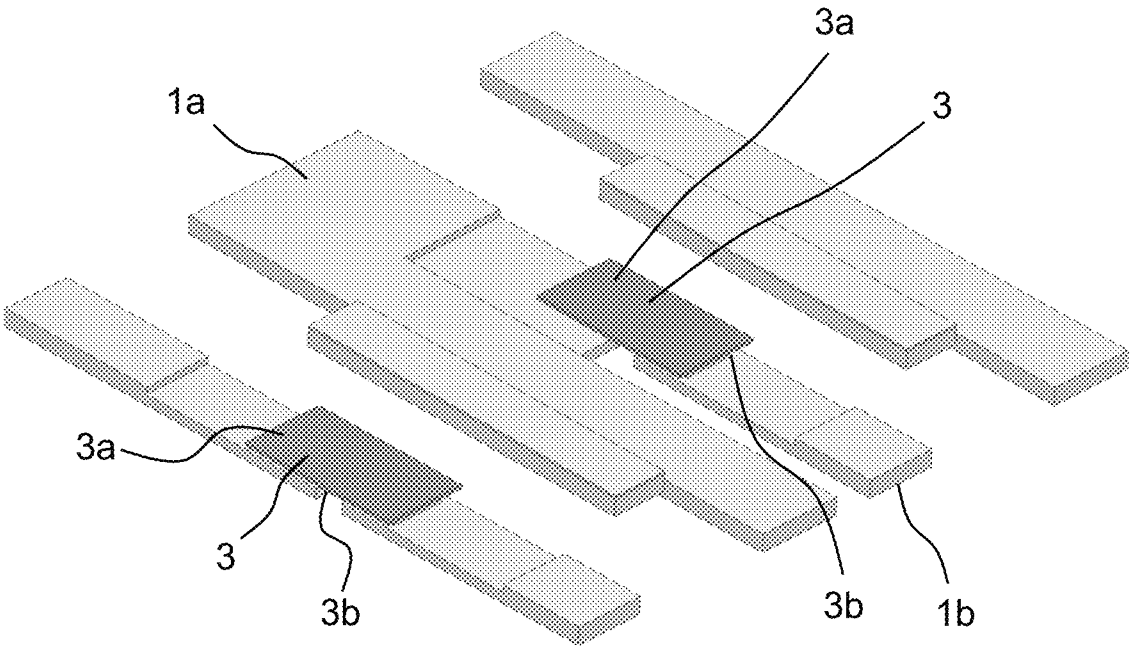
FIG. 3 depicts first semiconductor structures placed on the lead frame of the semiconductor device.
Figure 5:
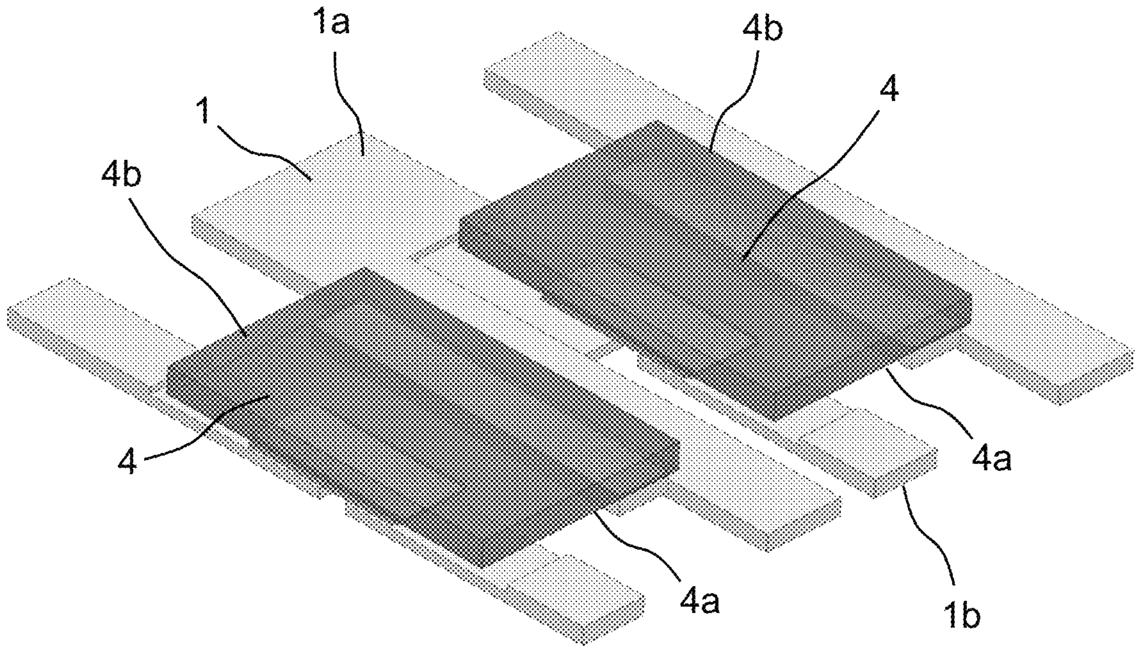
FIG. 5 depicts second semiconductor structures placed on the first semiconductor structures.

During a second step, step b, at least one first semiconductor structure 3 each having a first surface side 3*a* and a second surface side 3*b* opposite from the first surface side 3*a*, is placed with its second surface side 3*b* on the first surface side 1*a* of the lead frame 1, as it is shown in FIG. 3. It should be noted that more first semiconductor structures 3 may be placed, on a lead frame 1 and/or on other semiconductor structures 3, as it is shown in FIG. 5. In such a case, step b comprises the sub-steps b1 and b2. During step b1 at least one semiconductor structure 3, preferably being at least one metal-oxide semiconductor field-effect transistor, is placed on the first surface side 1*a* of the lead frame 1. As a next step, step b2 is performed where at least one further semiconductor structure 4, preferably at least one high-electron-mobility transistor, is placed on the first surface side 1*a* of the lead frame 1, wherein the at least one further semiconductor structure 4 at least partly overlaps the at least one semiconductor structure 3.

Figure 7:
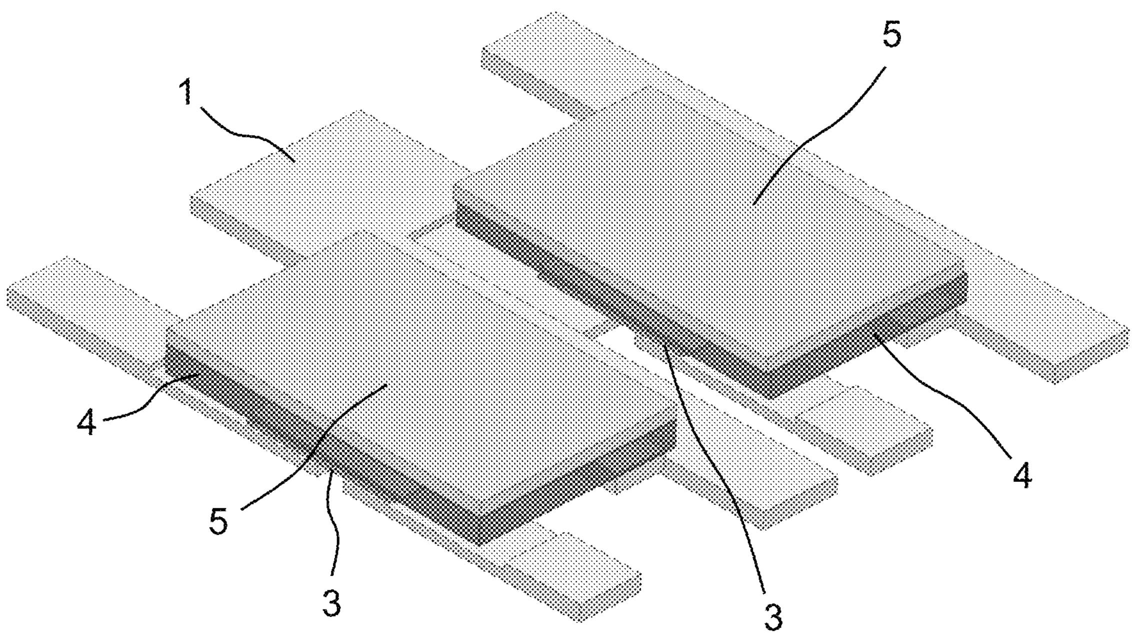
FIG. 7 depicts a placing heat slugs on the second semiconductor structures.

Next, step c of the method according to the disclosure is performed, wherein at least one heat slug 5 is placed on the first surface side 3*a*-4*a* of the at least one semiconductor structure 3, 4. This is shown in FIG. 7.

Figure 8:
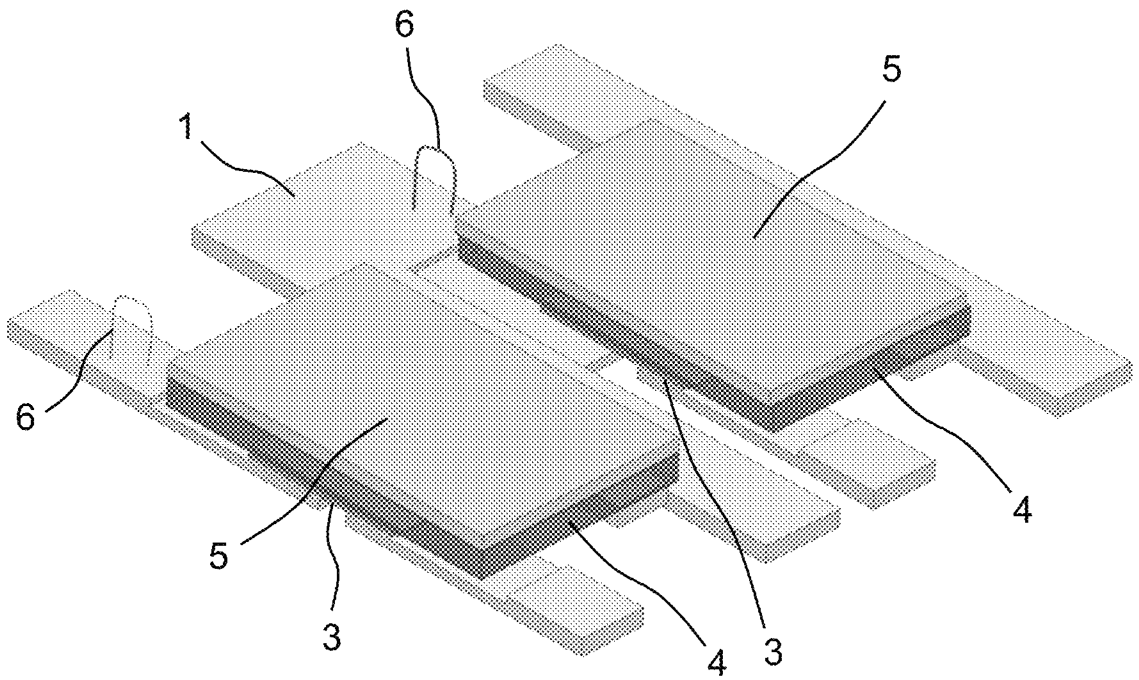
FIG. 8 depicts a feedthrough wires connected to terminals of the lead frame.

During a further step, denoted as step d of the method according to the disclosure, at least one feedthrough wire 6 is down bonded on at least one terminal on the first surface side 1*c* of the lead frame 1, as it is shown in FIG. 8. It should be noted that step c of placing at least one heat slug 5 on the first surface side 3*a*-4*a* of the at least one semiconductor structure 3, 4 may be performed after step d. Also the at least one feedthrough wire 6 may be in form of a loop, as shown in FIG. 8.

Figure 9:
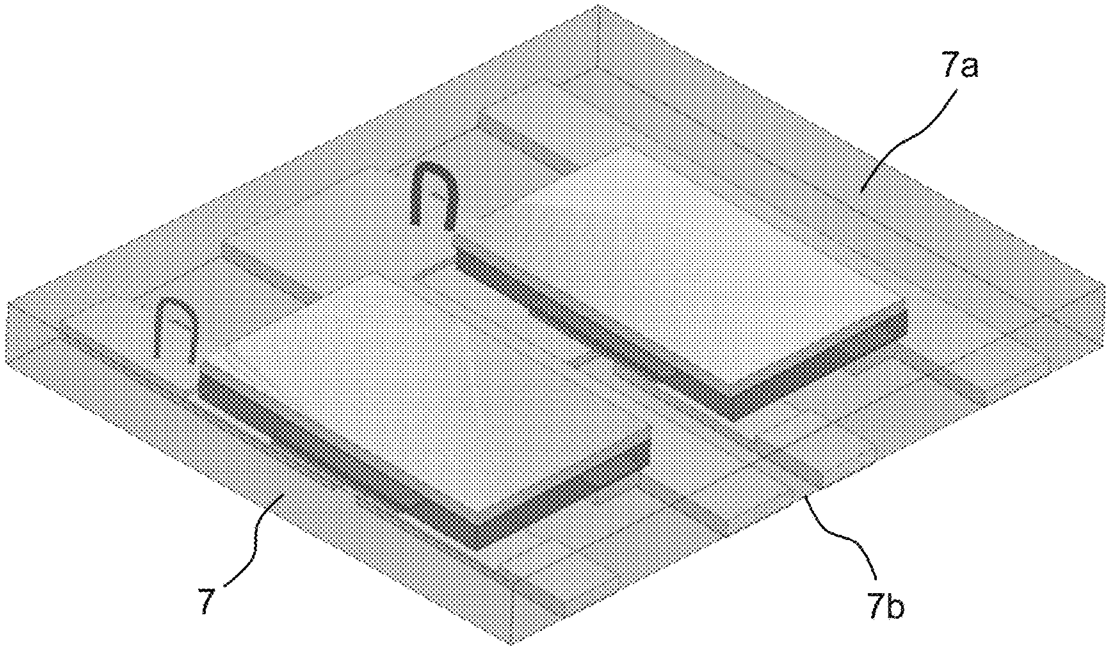
FIG. 9 depicts a package comprising lead frame, the first semiconductor structures, the second semiconductor structures, the heat slugs and the feedthrough wires.

Next, during step e of the method according to the disclosure, a package 7 is made by molding the lead frame 1, the at least one semiconductor structure 3, 4, the at least one heat slug 5 and the at least one feedthrough wire 6 into a package having a first surface side 7*a* and a second surface side 7*b* opposite to the first surface side 7*a*. The package 7 thus obtained is shown in FIG. 9.

During a next step of the method according to the disclosure, denoted as step f, the at least one feedthrough wire 6 and the at least one the heat slug 5 are exposed from the first surface side 7*a*. This step f is performed by removing a layer of material from the first surface side 7*a* of the package 7. Preferably it is done by polishing of the first (top) surface side 7*a* of a package 7.

During a following step g of the method according to the disclosure, the forming of an electrical connection is performed. This electrical connection is formed by printing a copper deposition 8 on the exposed parts of the at least one heat slug 5 and the at least one feedthrough wire 6. The result of step g is shown in FIG. 12.

Figure 13:
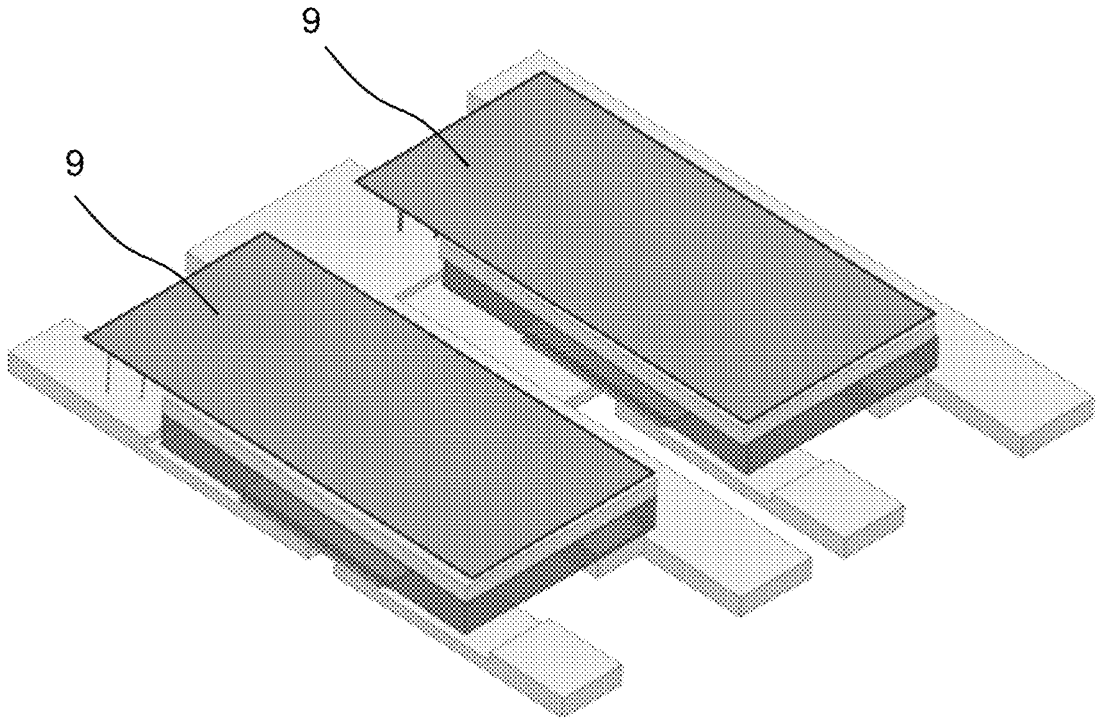
FIG. 13 depicts the semiconductor where a surface of the copper deposition has been covered with a metal during plating.

The last step, step h, results in plating of the printed copper deposition 8 with a plating material resulting in a plated surface 9 in or on the first surface 7*a* of the package, as shown in FIG. 13.

Figure 10:
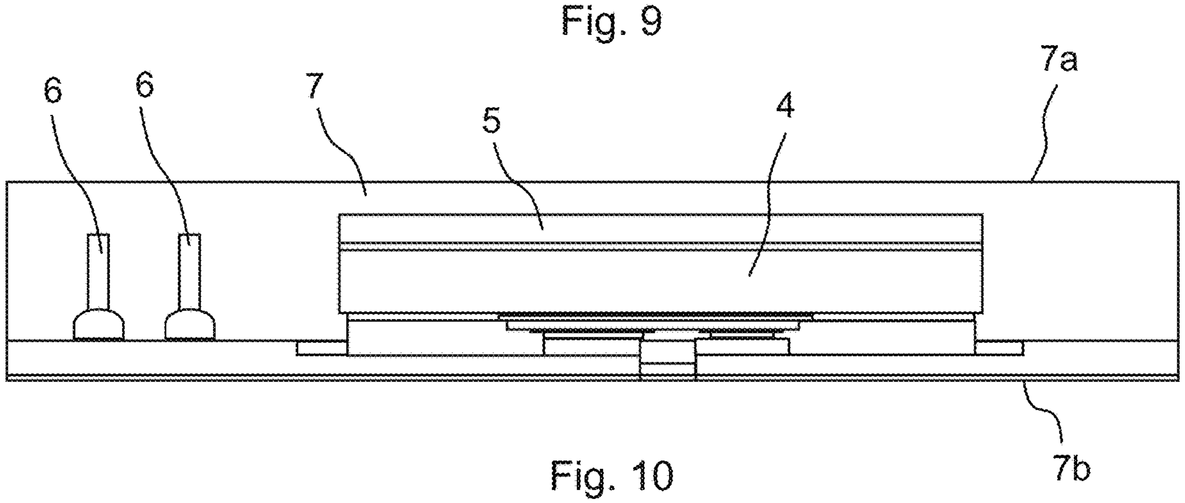
FIG. 10 depicts a cross section of the semiconductor device before exposing the feedthrough wire.
Figure 11:
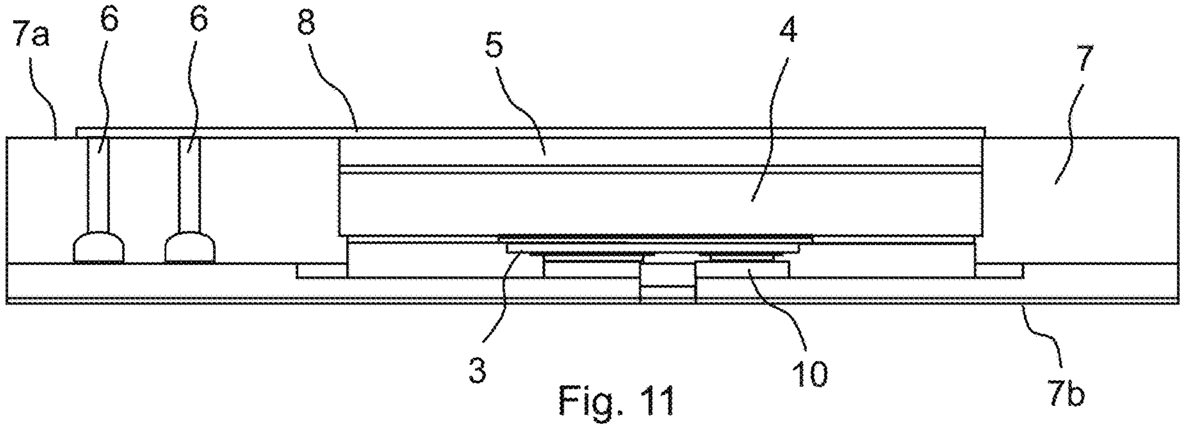
FIG. 11 depicts a cross section of the semiconductor device after forming an electrical connection through printing of a copper deposition on the exposed parts.
Figure 12:
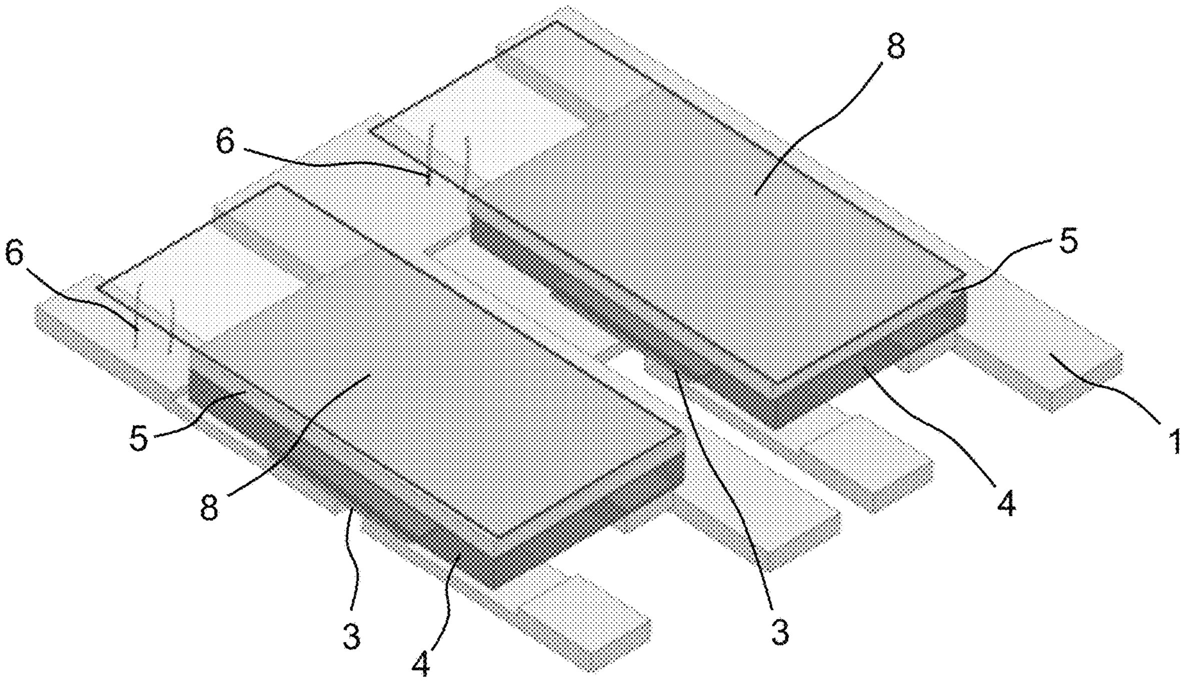
FIG. 12 depicts the semiconductor device where exposed surfaces of the second semiconductor structures and the feedthrough wires have been connected with the copper deposition.

In FIGS. 12 and 13 the package 7 is not show for a clarity reasons. It should be however noted that the shown structure is enclosed within the package 7 as shown in FIGS. 9, 10 and 11.

Figure 2:
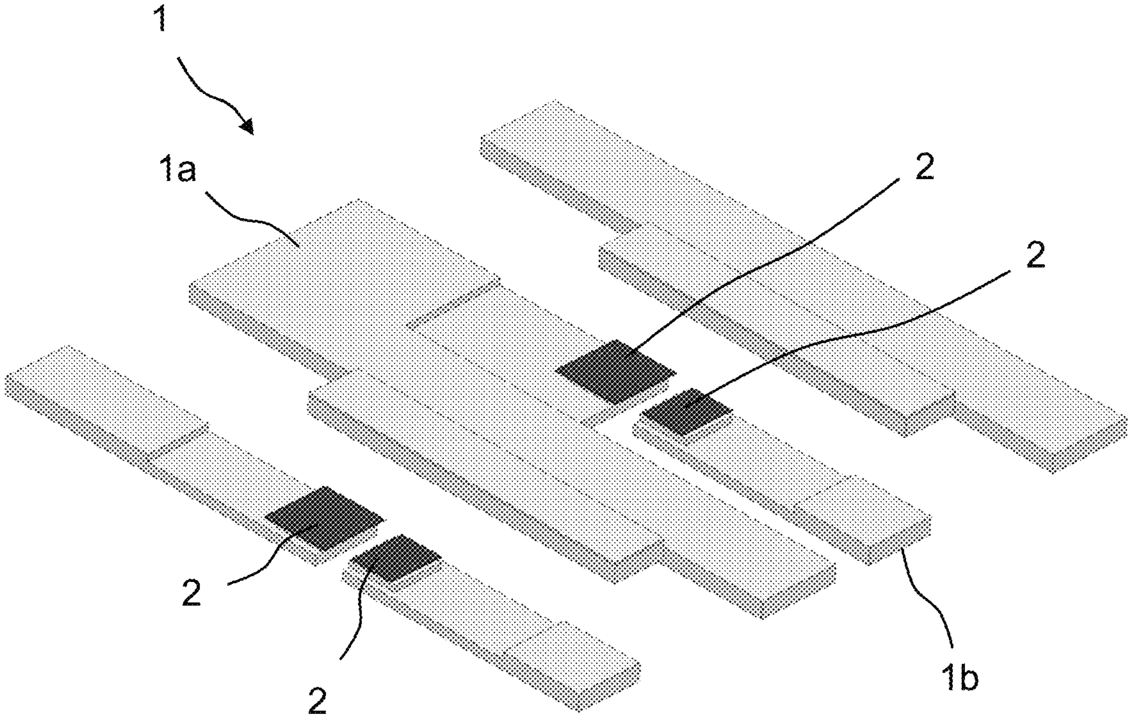
FIG. 2 depicts a solder placed on the lead frame of a semiconductor device.
Figure 4:
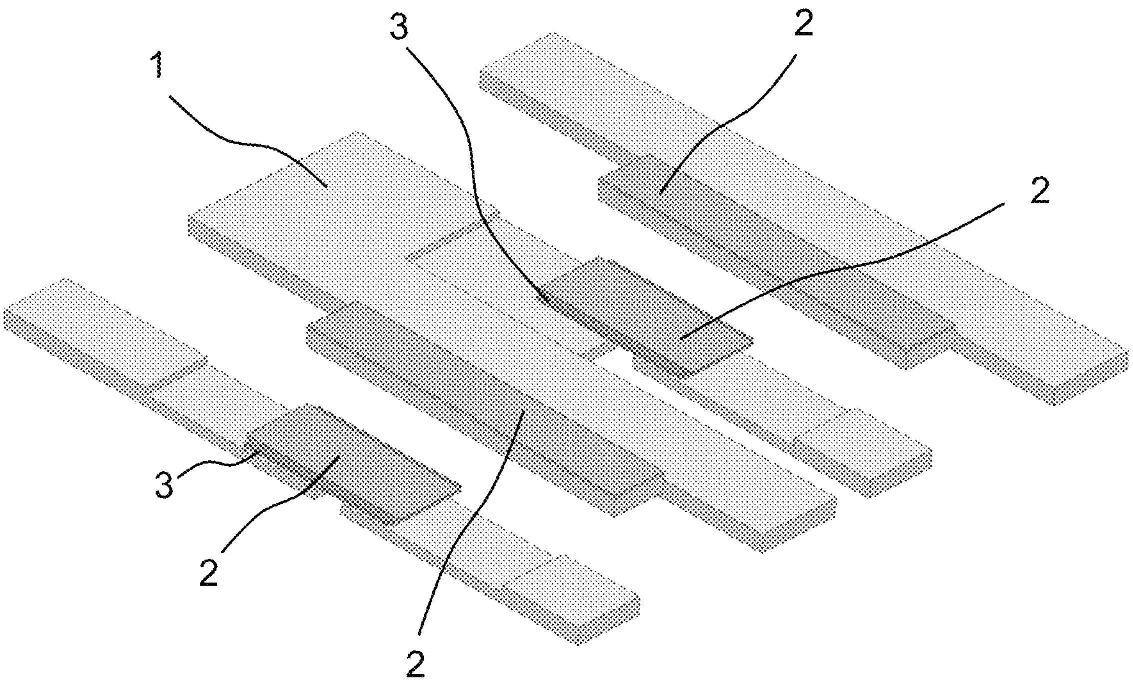
FIG. 4 depicts a solder placed on the first semiconductor structures.
Figure 6:
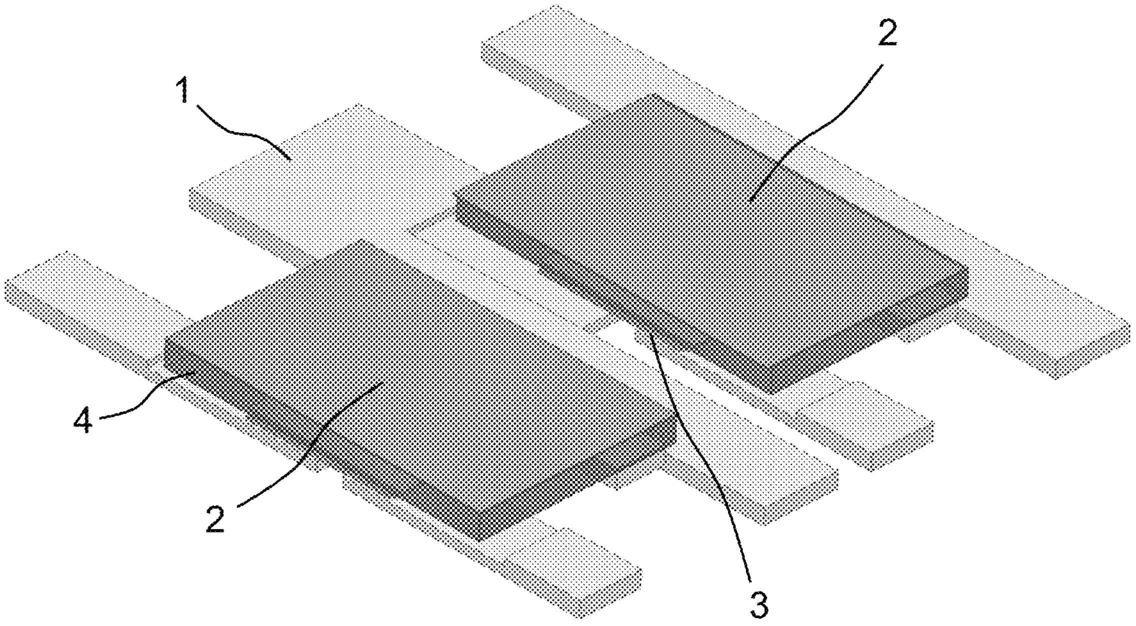
FIG. 6 depicts a solder placed on the second semiconductor structures.

In a further detailed example of the disclosure, the steps a-c involve the step of sintering or the step of soldering. This is shown in FIGS. 2, 4, 6.

What is claimed is:

1. A semiconductor device consisting of a package with a first surface side and a second surface side opposite to the first surface side, the package comprising:

at least one semiconductor structure and a group of terminals, wherein the group of terminals is connected to the at least one semiconductor structure and mounted and exposed on the second surface side of the package;

at least one heat slug mounted and exposed on the first surface side of the package; and at least one feedthrough wire in the package, wherein the package comprises, at the first surface side an exposed portion of the at least one feedthrough wire and an exposed portion of the at least one heat slug, and a continuous plated surface extending in a plane parallel to the first surface side of the package on the exposed portion of the at least one feedthrough wire and on the exposed portion of the at least one heat slug to electrically connect the at least one feedthrough wire with the at least one heat slugs.

2. The device according to claim 1, wherein the semiconductor structure is a transistor.

3. A method of manufacturing the semiconductor device according to claim 2, the method comprising the steps of:

a) preparing a lead frame having a first surface side and a second surface side opposite from the first surface side, the lead frame comprising a group of terminals of the first surface side;

b) placing the at least one semiconductor structure having a first surface side and a second surface side opposite from the first surface side, with its second surface side on the first surface side of the lead frame;

c) placing the at least one heat slug on the first surface side of the at least one semiconductor structure;

d) down bonding the at least one feedthrough wire on the at least one terminal on the first surface side of the lead frame;

e) molding the lead frame, the at least one semiconductor structure, the at least one heat slug and the at least one feedthrough into the package having the first surface side and the second surface side opposite to the first surface side;

f) exposing the at least one feedthrough wire and the at least one the heat slug through removal of a layer of material from the first surface side of the package;

g) forming an electrical connection through printing of a copper deposition on the exposed parts of the at least one heat slug and the at least one feedthrough wire; and h) plating of the printed copper deposition.

4. The device according to claim 1, wherein the semiconductor structure is a cascode that comprises a high-electron-mobility transistor and a metal-oxide semiconductor field-effect transistor, wherein the high-electron-mobility transistor has a source terminal that is electrically connected to a drain terminal of the metal-oxide semiconductor field-effect transistor, and wherein the high-electron-mobility transistor has a gate terminal that is electrically connected to a source terminal of the metal-oxide semiconductor field-effect transistor.

5. A method of manufacturing the semiconductor device according to claim 4, the method comprising the steps of:

a) preparing a lead frame having a first surface side and a second surface side opposite from the first surface side, the lead frame comprising a group of terminals of the first surface side;

b) placing the at least one semiconductor structure having a first surface side and a second surface side opposite from the first surface side, with its second surface side on the first surface side of the lead frame;

c) placing the at least one heat slug on the first surface side of the at least one semiconductor structure;

d) down bonding the at least one feedthrough wire on at least one terminal on the first surface side of the lead frame;

e) molding the lead frame, the at least one semiconductor structure, the at least one heat slug and the at least one feedthrough into the package having the first surface side and the second surface side opposite to the first surface side;

f) exposing the at least one feedthrough wire and the at least one the heat slug through removal of a layer of material from the first surface side of the package;

g) forming an electrical connection through printing of a copper deposition on the exposed parts of the at least one heat slug and the at least one feedthrough wire; and h) plating of the printed copper deposition.

6. The device according to claim 4, wherein the semiconductor structures form a half bridge.

7. The device according to claim 6, further comprising: a first terminal that is connected to the drain terminal of the high-electron-mobility transistor of a first cascode, a second terminal is electrically connected to the gate terminal of the metal-oxide semiconductor field-effect transistor of the first cascode, a third terminal is electrically connected to the source terminal of the metal-oxide semiconductor field-effect transistor and the gate terminal of the high-electron-mobility transistor of the first cascode and the drain terminal of the high-electron-mobility transistor of a second cascode, a fourth terminal is electrically connected to the gate terminal of the metal-oxide semiconductor field-effect transistor of the second cascode and a fifth terminal is electrically connected to the source terminal of the metal-oxide semiconductor field-effect transistor and the gate terminal of the high-electron-mobility transistor of the second cascode, and wherein the third terminal is electrically connected with a first heat slug and the fifth terminal is electrically connected to a second heat slug.

8. A method of manufacturing the semiconductor device according to claim 7, the method comprising the steps of:

a) preparing a lead frame having a first surface side and a second surface side opposite from the first surface side, the lead frame comprising the group of terminals on the first surface side;

b) placing the at least one semiconductor structure having a first surface side and a second surface side opposite from the first surface side, with its second surface side on the first surface side of the lead frame;

c) placing the at least one heat slug on the first surface side of the at least one semiconductor structure;

d) down bonding the at least one feedthrough wire on the at least one terminal of the group of terminals on the first surface side of the lead frame;

e) molding the lead frame, the at least one semiconductor structure, the at least one heat slug and the at least one feedthrough into the package having the first surface side and the second surface side opposite to the first surface side;

f) exposing the at least one feedthrough wire and the at least one the heat slug through removal of a layer of material from the first surface side of the package;

g) forming an electrical connection through printing of a copper deposition on the exposed parts of the at least one heat slug and the at least one feedthrough wire; and h) plating of the printed copper deposition.

9. A method of manufacturing the semiconductor device according to claim 6, the method comprising the steps of:

a) preparing a lead frame having a first surface side and a second surface side opposite from the first surface side, the lead frame comprising the group of terminals on the first surface side;

b) placing the at least one semiconductor structure having a first surface side and a second surface side opposite from the first surface side, with its second surface side on the first surface side of the lead frame;

c) placing the at least one heat slug on the first surface side of the at least one semiconductor structure;

d) down bonding the at least one feedthrough wire on the at least one terminal of the group of terminals on the first surface side of the lead frame;

e) molding the lead frame, the at least one semiconductor structure, the at least one heat slug and the at least one feedthrough into the package having the first surface side and the second surface side opposite to the first surface side;

f) exposing the at least one feedthrough wire and the at least one the heat slug through removal of a layer of material from the first surface side of the package;

g) forming an electrical connection through printing of a copper deposition on the exposed parts of the at least one heat slug and the at least one feedthrough wire; and h) plating of the printed copper deposition.

10. A method of manufacturing the semiconductor device according to claim 1, the method comprising the steps of:

a) preparing a lead frame having a first surface side and a second surface side opposite from the first surface side, the lead frame comprising the group of terminals of the first surface side;

b) placing the at least one semiconductor structure having the first surface side and the second surface side opposite from the first surface side, with its second surface side on the first surface side of the lead frame;

c) placing the at least one heat slug on the first surface side of the at least one semiconductor structure;

d) down bonding the at least one feedthrough wire on at least one terminal on the first surface side of the lead frame;

e) molding the lead frame, the at least one semiconductor structure, the at least one heat slug and the at least one feedthrough into the package having the first surface side and the second surface side opposite to the first surface side;

f) exposing the at least one feedthrough wire and the at least one the heat slug through removal of a layer of material from the first surface side of the package;

g) forming an electrical connection through printing of a copper deposition on the exposed parts of the at least one heat slug and the at least one feedthrough wire; and h) plating of the printed copper deposition.

11. The method according to claim 10, wherein the removal of step f) is performed by polishing.

12. The method according to claim 11, wherein steps a-d) involve the step of sintering or the step of soldering.

13. The method according to claim 11, wherein step b) further comprises the sub-steps b1) and b2):

b1) placing as the at least one semiconductor structure at least one metal-oxide semiconductor field-effect transistor on the first surface side of the lead frame; and b2) placing as at least one further semiconductor structure at least one high-electron-mobility transistor on the first surface side of the lead frame, so that every high-electron-mobility transistor at least partly overlaps the at least one metal-oxide semiconductor field-effect transistor.

14. The method according to claim 10, wherein steps a-d) involve the step of sintering or the step of soldering.

15. The method according to claim 14, wherein step b) further comprises the sub-steps b1) and b2):

b1) placing as the at least one semiconductor structure at least one metal-oxide semiconductor field-effect transistor on the first surface side of the lead frame; and b2) placing as at least one further semiconductor structure at least one high-electron-mobility transistor on the first surface side of the lead frame, so that every high-electron-mobility transistor at least partly overlaps the at least one metal-oxide semiconductor field-effect transistor.

16. The method according to claim 10, wherein step b) further comprises the sub-steps b1) and b2):

b1) placing as the at least one semiconductor structure at least one metal-oxide semiconductor field-effect transistor on the first surface side of the lead frame; and b2) placing as at least one further semiconductor structure at least one high-electron-mobility transistor on the first surface side of the lead frame, so that every high-electron-mobility transistor at least partly overlaps the at least one metal-oxide semiconductor field-effect transistor.

* * * * *